(12) United States Patent
Lee

(10) Patent No.: US 11,793,040 B2
(45) Date of Patent: Oct. 17, 2023

(54) DISPLAY DEVICE

(71) Applicant: Samsung Display Co., LTD., Yongin-si (KR)

(72) Inventor: Dae Geun Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 176 days.

(21) Appl. No.: 16/926,384

(22) Filed: Jul. 10, 2020

(65) Prior Publication Data

US 2021/0066434 A1 Mar. 4, 2021

(30) Foreign Application Priority Data

Sep. 2, 2019 (KR) .................. 10-2019-0108312

(51) Int. Cl.
*H10K 59/131* (2023.01)
*H01L 23/498* (2006.01)
*H05K 1/11* (2006.01)

(52) U.S. Cl.
CPC ..... *H10K 59/131* (2023.02); *H01L 23/49838* (2013.01); *H05K 1/111* (2013.01)

(58) Field of Classification Search
CPC .......... H01L 27/3276; H01L 23/49838; H01L 23/4985; H01L 2223/54426; H01L 2223/54486; H01L 23/544; H01L 27/3244; H05K 1/111; H05K 2201/09781; H05K 1/117; H05K 1/147; H05K 3/361; H05K 2203/166; G02F 1/13458; G02F 1/136286; G02F 1/133354; G02F 1/13452; H10K 59/131
See application file for complete search history.

(56) References Cited

U.S. PATENT DOCUMENTS

| | | | |
|---|---|---|---|
| 2006/0291179 A1* | 12/2006 | Tanimori | H05K 3/361 361/784 |
| 2016/0291723 A1* | 10/2016 | Kurasawa | G02F 1/13338 |
| 2017/0357122 A1* | 12/2017 | Oh | G02F 1/1341 |
| 2019/0164901 A1* | 5/2019 | Liu | H01L 27/124 |
| 2020/0295113 A1 | 9/2020 | Lee | |

FOREIGN PATENT DOCUMENTS

| | | |
|---|---|---|
| KR | 1020070106261 | 11/2007 |
| KR | 1020180070774 | 6/2018 |
| KR | 1020200110490 A | 9/2020 |

* cited by examiner

*Primary Examiner* — Benjamin Tzu-Hung Liu
(74) *Attorney, Agent, or Firm* — CANTOR COLBURN LLP

(57) ABSTRACT

A display device includes a base substrate in which a display area and a pad area disposed around the display area are defined, a plurality of panel pads disposed on the pad area of the base substrate, and a printed circuit board attached to the pad area of the base substrate. The printed circuit board includes a plurality of circuit pads, the plurality of circuit pads include a first lead align mark, and the first lead align mark includes a plurality of first patterns passing through the first lead align mark from a surface of the first lead align mark in a thickness direction.

16 Claims, 19 Drawing Sheets

FIG. 1
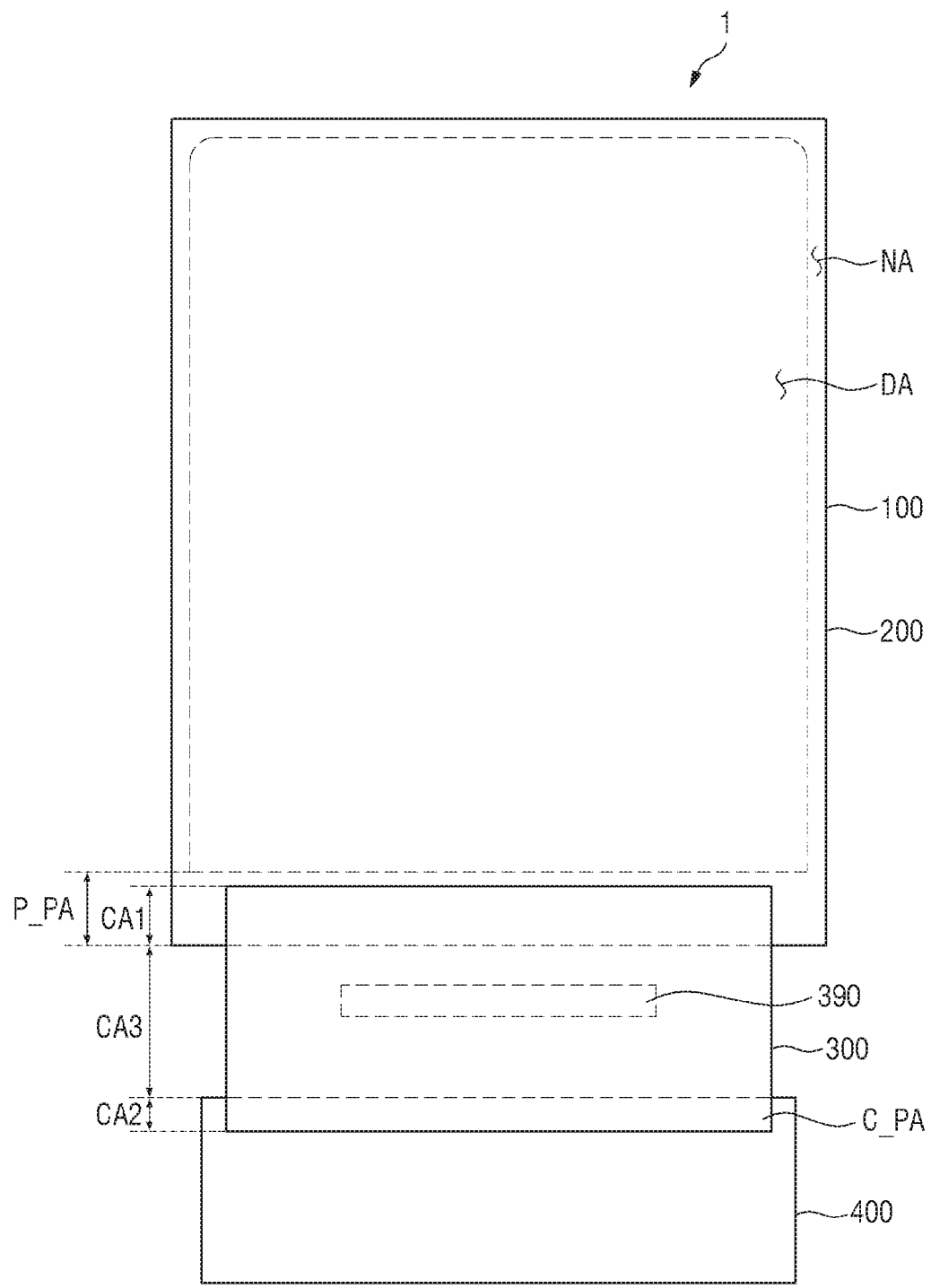
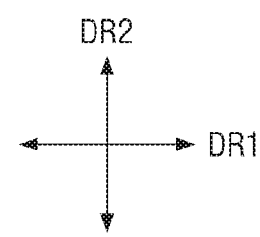

FIG. 4
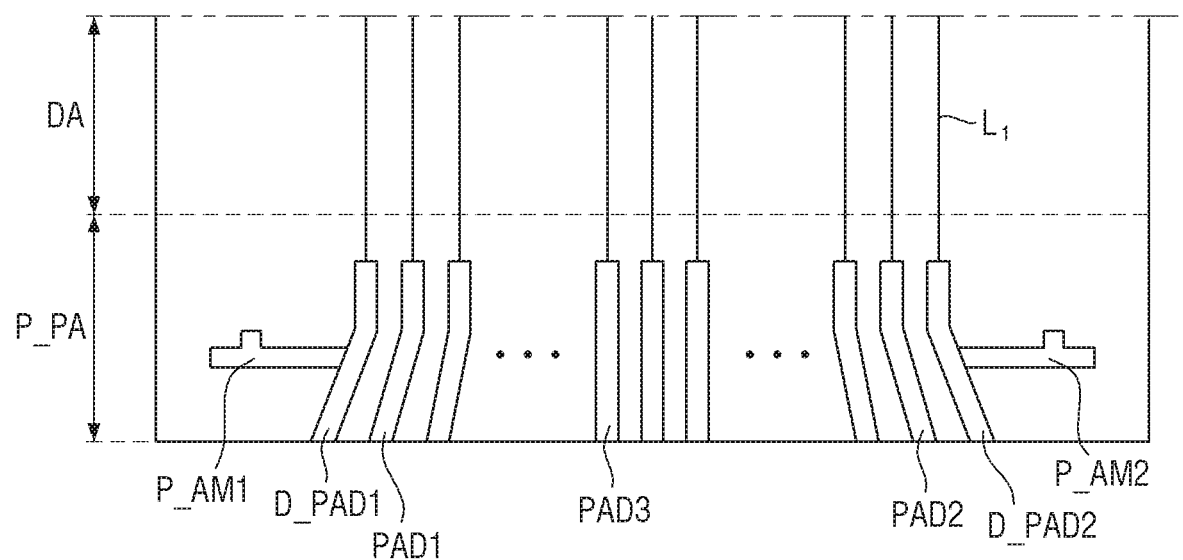
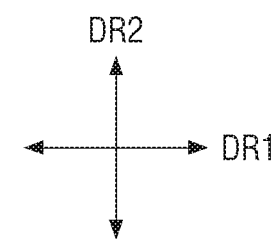

DISPLAY DEVICE

This application claims priority to Korean Patent Application No. 10-2019-0108312, filed on Sep. 2, 2019, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

Display devices visually display data. The display devices include a substrate partitioned into a display area and a non-display area. In the display area, a plurality of pixels is disposed on the substrate, and in the non-display area, a plurality of pads and the like are disposed on the substrate. A flexible film, e.g., chip on film ("COF"), on which a driving circuit or the like is mounted is coupled to the plurality of pads to transmit driving signals to the pixel.

The flexible film may include a plurality of leads coupled to the plurality of pads, and each of the leads may be bonded to the separated pad. The bonding may be performed by an ultrasonic bonding process.

SUMMARY

Exemplary embodiments of the invention are directed to providing a display device capable of increasing adhesion between a display panel and a printed circuit board by an underfill resin.

Features and advantages in the invention are not limited to the above-described technical features and advantages, and other technical features and advantages which are not mentioned may be clearly understood by those skilled in the art from the specification and the accompanying drawings.

In an exemplary embodiment of the invention, there is provided a display device including a base substrate in which a display area and a pad area disposed around the display area are defined, a plurality of panel pads disposed on the pad area of the base substrate, and a printed circuit board attached to the pad area of the base substrate, where the printed circuit board includes a plurality of circuit pads, the plurality of circuit pads includes a first lead align mark, and the first lead align mark includes a plurality of first patterns passing through the first lead align mark from a surface of the first lead align mark in a thickness direction.

In an exemplary embodiment, the plurality of circuit pads may further include a first lead signal line which extends in a first direction, the plurality of panel pads may include a first panel signal line which corresponds to the first lead signal line and extends in the first direction, and the first lead signal line and the first panel signal line may be electrically connected.

In an exemplary embodiment, the plurality of circuit pads may further include a second lead align mark spaced apart from the first lead align mark with the first lead signal line therebetween, and the second lead align mark may include a plurality of second patterns passing through the second lead align mark from a surface of the second lead align mark in the thickness direction.

In an exemplary embodiment, the plurality of circuit pads may further include a second lead signal line disposed between the first lead signal line and the second lead align mark, the plurality of panel pads may include a second panel signal line corresponding to the second lead signal line, and the second lead signal line and the second panel signal line may be electrically connected.

In an exemplary embodiment, the plurality of panel pads may further include a first panel dummy line which is disposed between the first panel signal line and the first lead align mark and extends in the first direction, and a first panel align mark which is physically connected to the first panel dummy line and extends in a second direction which crosses the first direction in a plan view.

In an exemplary embodiment, the plurality of panel pads may further include a second panel dummy line which is disposed between the second panel signal line and the second lead align mark and extends in the first direction, and a second panel align mark which is physically connected to the second panel dummy line and extends in the second direction in the plan view.

In an exemplary embodiment, the plurality of circuit pads may further include a first lead dummy line corresponding to the first panel dummy line, and a second lead dummy line corresponding to the second panel dummy line.

In an exemplary embodiment, the plurality of circuit pads may further include a third lead dummy line disposed between the first lead dummy line and the first lead align mark, and a fourth lead dummy line disposed between the second lead dummy line and the second lead align mark.

In an exemplary embodiment, the third lead dummy line may be disposed to partially overlap the first panel align mark, and the fourth lead dummy line may be disposed to partially overlap the second panel align mark.

In an exemplary embodiment, the first lead signal line and the first panel signal line may be directly connected.

In an exemplary embodiment, the first lead signal line and the first panel signal line may be ultrasonically bonded.

In an exemplary embodiment, the display device may further include a coupling member disposed between the first lead signal line and the first panel signal line, where the coupling member may include an anisotropic conductive film, and the first lead signal line and the first panel signal line may be electrically connected to each other by the anisotropic conductive film.

In an exemplary embodiment, the display device may further include a resin which is disposed between the printed circuit board and the base substrate and contacts surfaces of the plurality of panel pads and surfaces of the plurality of circuit pads, where the resin may contact the first lead align mark and fill a first pattern of the plurality of first patterns of the first lead align mark.

In an exemplary embodiment, the plurality of first patterns may extend from a first end of the first lead align mark and terminate in the first lead align mark in a plan view.

In an exemplary embodiment, the plurality of first patterns may extend to a second end of the first lead align mark from a first end of the first lead align mark and completely cross the first lead align mark in a plan view.

In an exemplary embodiment, the plurality of first patterns may be disposed in the first lead align mark and may be completely surrounded by a material constituting the first lead align mark in a plan view.

In another exemplary embodiment of the invention, there is provided a display device including a printed base substrate, and a plurality of circuit pads disposed on the printed base substrate, where the plurality of circuit pads includes a lead align mark, and the lead align mark includes a plurality of patterns passing through the lead align mark from a surface of the lead align mark in a thickness direction.

In an exemplary embodiment, the plurality of patterns may extend from a first end of the lead align mark and terminate in the lead align mark in a plan view.

In an exemplary embodiment, the plurality of patterns may extend to a second end of the lead align mark from a first end of the lead align mark and completely cross the lead align mark in a plan view.

In an exemplary embodiment, the plurality of patterns may be disposed in the lead align mark and may be completely surrounded by a material constituting the lead align mark in a plan view.

Specific items of other exemplary embodiments are included in the detailed descriptions and drawings.

BRIEF DESCRIPTION OF THE DRAWINGS

The above and other exemplary embodiments and features of the invention will become more apparent by describing exemplary embodiments thereof in detail with reference to the attached drawings, in which:

FIG. 1 is a plan view of an exemplary embodiment of a display device;

FIG. 4 is a plan view of an exemplary embodiment of a panel pad area of a display panel;

DETAILED DESCRIPTION

Figure 2:
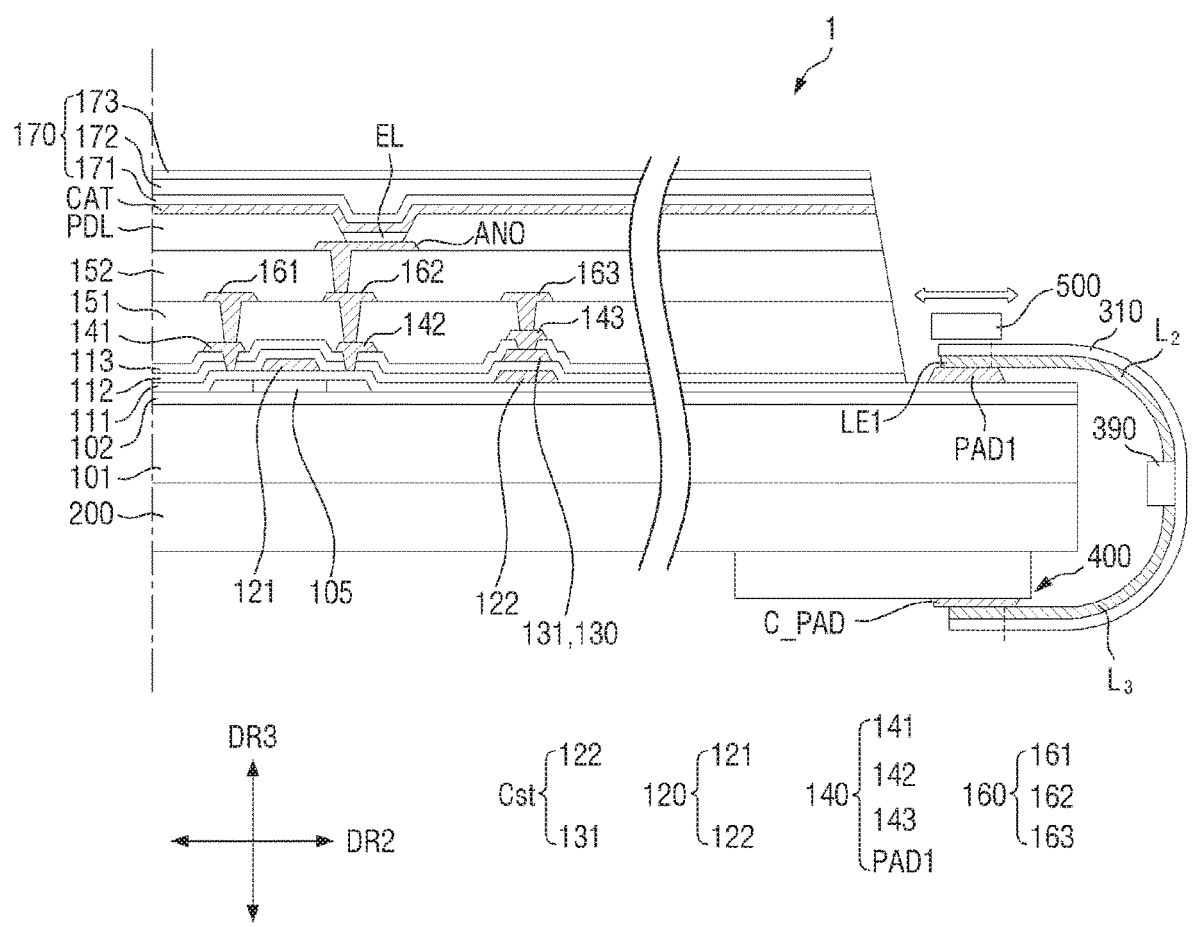
FIG. 2 is a cross-sectional view of an exemplary embodiment of the display device.

Advantages and characteristics of the invention and a method of achieving the above will be apparent with reference to embodiments which will be described in detail with the accompanying drawings. However, the invention is not limited to the exemplary embodiments which will be described below and may be implemented in different forms. That is, the invention is only defined by the scope of the claims.

A case in which an element or a layer is "above" or "on" another element or layer includes all cases in which not only the element or layer are directly on another element or layer but also another element or layer is interposed between the element or layer and the other element or layer. On the other hand, a case in which the element or the layer is "directly on" or "directly above" another element or layer refers to a case in which no other elements or layer are interposed between the element or layer and the other element or layer.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

The same reference numerals will be used for the same or similar components through the entire specification.

Hereinafter, embodiments of the invention will be described with reference to the accompanying drawings.

A display device 1 displays a video or a still image and may be used as a display screen of not only portable electronic devices such as a mobile phone, a smart phone, a tablet personal computer ("PC"), a smart watch, a watch phone, a mobile communication terminal, an electronic notebook, an electronic book, a portable multimedia player ("PMP"), a navigation device, an ultra-mobile personal computer ("UMPC"), and the like but also various products such as a television, a notebook, a monitor, a billboard, an Internet of Things ("IoT") device, or the like.

FIG. 1 is a plan view of an exemplary embodiment of a display device.

Referring to FIG. 1, the display device 1 may include a display panel 100 displaying an image, a panel lower sheet 200 disposed under the display panel 100, a first circuit board 300 connected to the display panel 100, and a second circuit board 400 connected to the first circuit board 300 and attached to a lower surface of the panel lower sheet 200.

As the display panel 100, for example, an organic light emitting display panel may be applied. In the following exemplary embodiments, although an example in which the organic light emitting display panel is applied as the display panel 100 is described, the invention is not limited thereto, and various display panels such as a liquid crystal display ("LCD") panel, a quantum dot organic light emitting display ("QD-OLED") panel, a quantum dot liquid crystal display ("QD-LCD") panel, a micro LED panel, and the like may be applied.

The display panel 100 includes a display area DA which displays an image and a non-display area NA disposed around the display area DA. In an exemplary embodiment, the display area DA may have a rectangular shape of which corners each have a right angle in a plan view or a rectangular shape of which corners are round in a plan view. The display area DA may have short sides and long sides. The short sides of the display area DA may be sides which extend in a first direction DR1. The long sides of the display area DA may be sides which extend in a second direction DR2. However, a planar shape of the display area DA is not limited to the rectangular shape, and the display area DA may have various shapes such as a circular shape, an elliptical shape, or the like. The non-display area NA may be disposed adjacent to both short sides and both long sides of the display area DA. In this case, the non-display area NA may surround all sides of the display area DA and define an edge of the display area DA. However, the invention is not limited thereto and the non-display area NA may be disposed adjacent to only both short sides or only both long sides of the display area DA.

The non-display area NA may further include a panel pad area P_PA at one side of the display panel 100 in the second direction DR2. The display panel 100 may include at least one panel signal line and at least one panel align mark. The panel signal line and the panel align mark may be disposed in the panel pad area P_PA.

The first circuit board 300, a printed circuit board, or a printed circuit film may be disposed on an upper surface of the panel pad area P_PA of the display panel 100.

The first circuit board 300 may include a first circuit area CA1 attached to the panel pad area P_PA, a second circuit area CA2 attached to the second circuit board 400, which will be described later, and a third circuit area CA3 disposed between the first circuit area CA1 and the second circuit area CA2. The first circuit area CA1 may overlap the panel pad area P_PA in a thickness direction. The second circuit area CA2 may overlap a circuit pad area C_PA of the second circuit board 400, which will be described later, in the thickness direction.

The first circuit board 300 may include a plurality of circuit pads. As will be described later, the plurality of circuit pads may include lead align marks, lead signal lines, and lead dummy lines.

The first circuit board 300 may include a data driving integrated circuit ("IC") 390. In an exemplary embodiment, the data driving IC 390 may be implemented as a data driving chip and a chip-on-film ("COF") manner that is attached to the display panel through the first circuit board 300 may be applied. However, the invention is not limited thereto, and the data driving IC 390 may be attached to a plastic substrate or a glass substrate IC in a chip-on-plastic ("COP") manner or a chip-on-glass ("COG") manner. The data driving IC 390 or the driving IC may be disposed in the third circuit area CA3 of the first circuit board 300.

The second circuit board 400 may be disposed on the second circuit area CA2 of the first circuit board 300. The drawing illustrates that the second circuit board 400 is disposed on the other surface of the first circuit board 300 but the invention is not limited thereto, and the second circuit board 400 may be disposed on one surface of the first circuit board 300.

The second circuit board 400 may include the circuit pad area C_PA attached to the second circuit area CA2 of the first circuit board 300. The second circuit board 400 may include circuit pad terminals (not shown) disposed in the circuit pad area C_PA.

Hereinafter, a configuration of the display panel 100, the panel lower sheet 200, the first circuit board 300, and the second circuit board 400 will be described.

Figure 3:
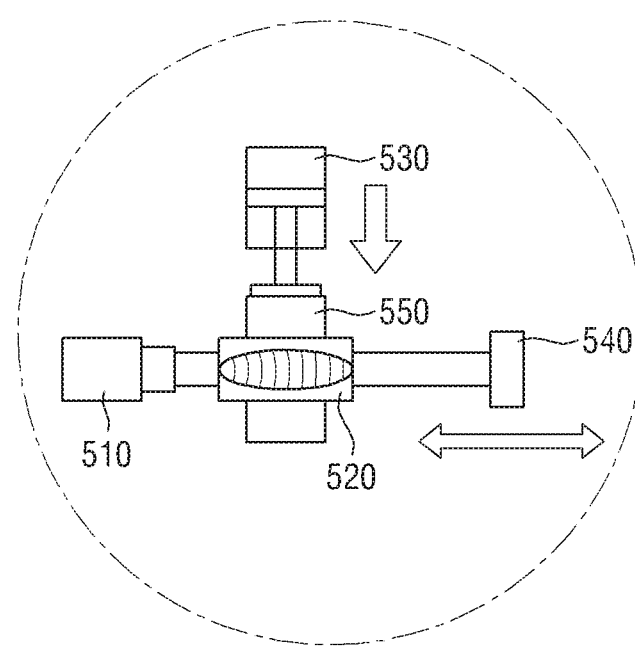
FIG. 3 is an enlarged view of an ultrasonic bonding device in FIG. 2.
Figure 5:
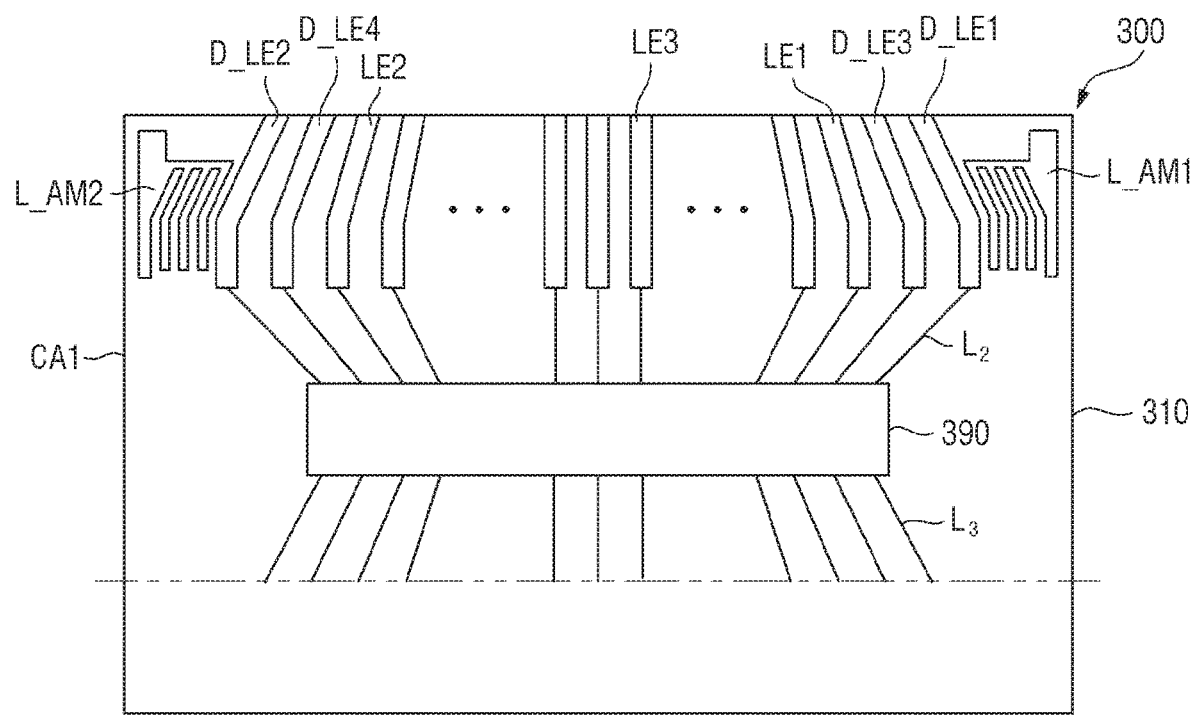
FIG. 5 is a plan view of an exemplary embodiment of a first circuit board.
Figure 6:
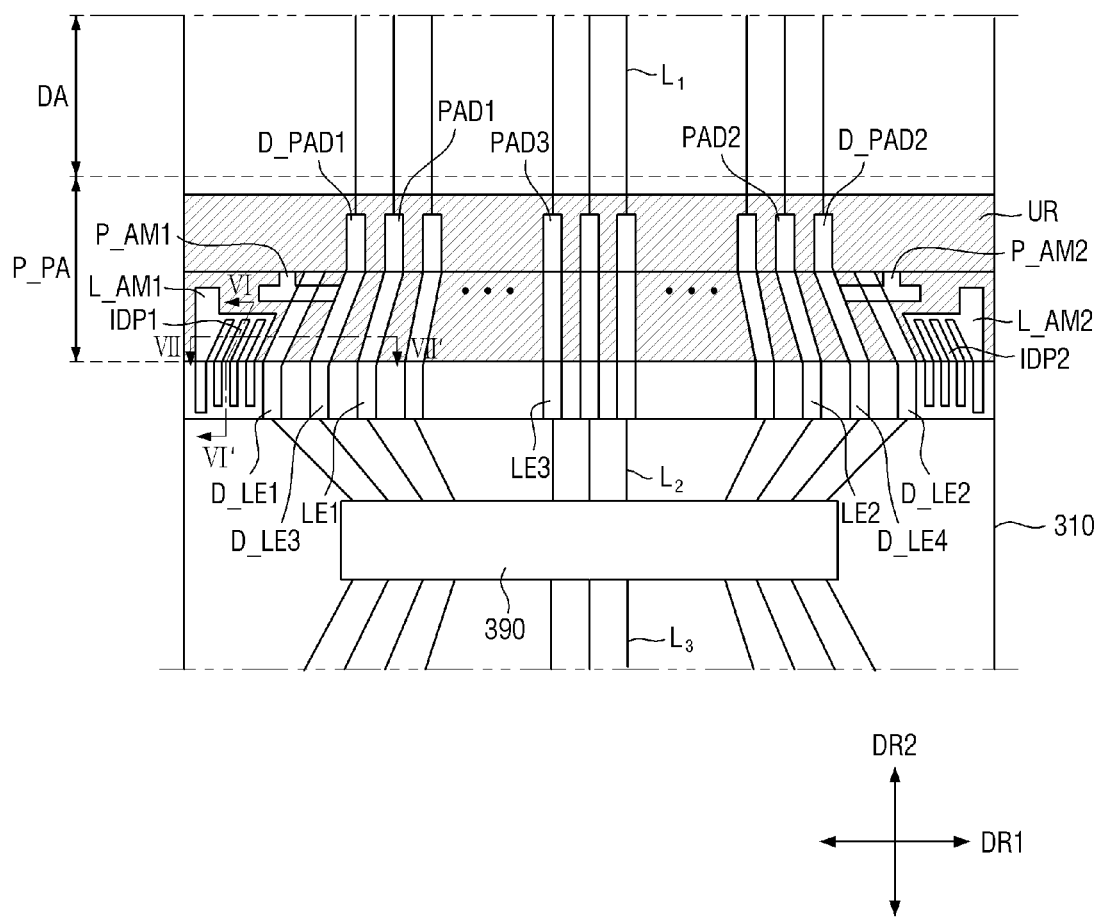
FIG. 6 is a plan view illustrating an exemplary embodiment of a state in which the first circuit board is attached to the panel pad area of the display panel.
Figure 7:
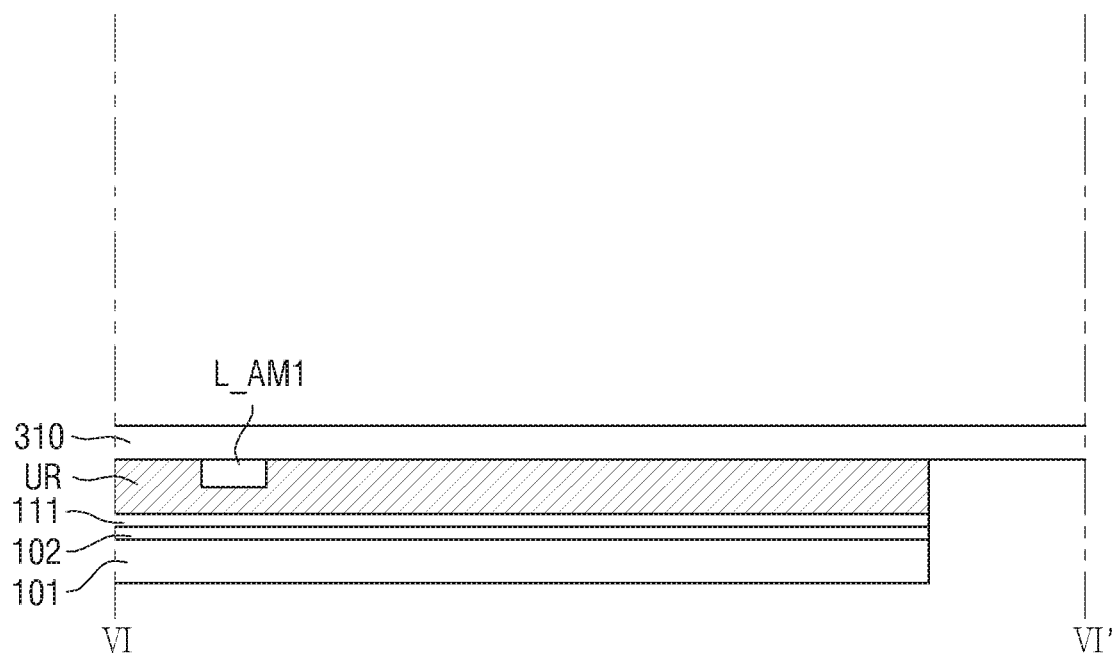
FIG. 7 is a cross-sectional view taken along line VI-VI' in FIG. 6.
Figure 8:
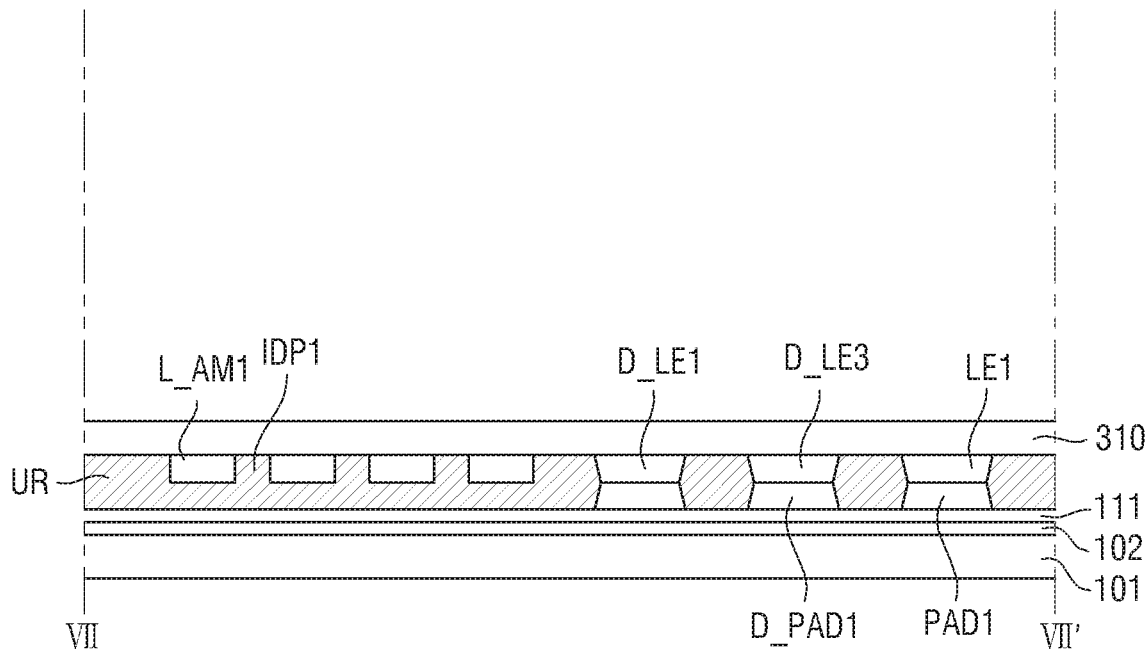
FIG. 8 is a cross-sectional view taken along line VII-VII' in FIG. 6.

FIG. 2 is a cross-sectional view of an exemplary embodiment of the display device, FIG. 3 is an enlarged view of an exemplary embodiment of an ultrasonic bonding device in FIG. 2, FIG. 4 is a plan view of an exemplary embodiment of the panel pad area of the display panel, FIG. 5 is a plan view of an exemplary embodiment of the first circuit board, FIG. 6 is a plan view illustrating an exemplary embodiment of a state in which the first circuit board is attached to the panel pad area of the display panel, FIG. 7 is a cross-sectional view taken along line VI-VI' in FIG. 6, and FIG. 8 is a cross-sectional view taken along line VII-VII' in FIG. 6.

FIG. 2 illustrates a cross-sectional shape of each of one pixel area and the panel pad area P_PA in FIG. 1. Further, FIG. 2 illustrates the first circuit board 300 (refer to FIG. 1) and the second circuit board 400 disposed on the panel pad area P_PA. FIG. 2 illustrates a state in which the panel signal lines and the lead signal lines which will be described later are coupled in the panel pad area P_PA. FIG. 6 illustrates a case in which the first circuit board 300 in FIG. 5 is attached to the display panel 100 in a laterally reversed state.

Referring to FIGS. 2 to 8, the display panel 100 may include a base substrate 101, a plurality of conductive layers, a plurality of insulation layers insulating the plurality of conductive layers, and an organic layer EL.

The base substrate 101 is disposed over the display area DA and the non-display area NA. The base substrate 101 may function to support various elements disposed thereon. In one embodiment, the base substrate 101 may be a rigid substrate including a rigid material such as flexible glass, quartz, or the like. However, the invention is not limited thereto, and the base substrate 101 may be a semi-flexible substrate or a flexible substrate including some flexible materials. In this case, the base substrate 101 may include at least one of polyethylene terephthalate ("PET"), polyimide ("PI"), polycarbonate ("PC"), polyethylene ("PE"), polypropylene ("PP"), polysulfone ("PSF"), polymethyl methacrylate ("PMMA"), tri-acetyl cellulose ("TAC"), a cycloolefin polymer ("COP"), and the like, for example.

A buffer layer 102 may be disposed on the base substrate 101. The buffer layer 102 may prevent the permeation of oxygen or moisture from the outside through the base substrate 101. Further, the buffer layer 102 may planarize a surface of the base substrate 101. In an exemplary embodiment, the buffer layer 102 may include at least one of a silicon nitride (SiNx) film, a silicon oxide (SiO$_2$) film, and a silicon oxynitride (SiOxNy) film, for example.

A semiconductor layer 105 may be disposed on the buffer layer 102. The semiconductor layer 105 forms a channel of a thin film transistor ("TFT"). The semiconductor layer 105 may be disposed in each pixel of the display area DA and may also be disposed in the non-display area NA in some cases. The semiconductor layer 105 may include a source/drain area and an active area. The semiconductor layer 105 may include polycrystalline silicon.

A first insulation layer 111 may be disposed on the semiconductor layer 105. The first insulation layer 111 may be disposed over an entire surface of the base substrate 101. The first insulation layer 111 may be a gate insulation film having a gate insulation function. The first insulation layer 111 may include a silicon compound, a metal oxide, or the like. In an exemplary embodiment, the first insulation layer 111 may include silicon oxide, silicon nitride, silicon oxynitride, aluminum oxide, tantalum oxide, hafnium oxide, zirconium oxide, titanium oxide, or the like, for example. The above may be used alone or in combination with each other.

A first conductive layer 120 may be disposed on the first insulation layer 111. In one embodiment, the first conductive layer 120 may include a gate electrode 121 of a TFT and a first electrode 122 of a storage capacitor Cst. The first conductive layer 120 may include a metallic material. In an exemplary embodiment, the first conductive layer 120 may include a metal including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), for example. The first conductive layer 120 may be a single film or a stacked film including the exemplified materials.

A second insulation layer 112 may be disposed on the first conductive layer 120. The second insulation layer 112 may insulate the first conductive layer 120 and a second conductive layer 130. Materials constituting the second insulation layer 112 may include materials exemplified as materials constituting the first insulation layer 111.

The second conductive layer 130 may be disposed on the second insulation layer 112. The second conductive layer 130 may include a second electrode 131 of the storage capacitor Cst. A material constituting the second conductive layer 130 may include materials exemplified as materials constituting the first conductive layer 120. The first electrode 122 of the storage capacitor Cst and the second electrode 131 of the storage capacitor Cst may form a capacitor through the second insulation layer 112.

A third insulation layer 113 may be disposed on the second conductive layer 130. The third insulation layer 113 may include the exemplified materials of the first insulation layer 111.

A third conductive layer 140 may be disposed on the third insulation layer 113. The third conductive layer 140 may include a source electrode 141, a drain electrode 142, a power voltage electrode 143, and the plurality of panel pads. FIG. 2 illustrates only a first panel signal line PAD1 among the plurality of panel pads, but the invention not limited thereto.

In an exemplary embodiment, the third conductive layer 140 may include a metal including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), for example. The third conductive layer 140 may be a single film including the exemplified materials but is not limited thereto and may be a stacked film. In an exemplary embodiment, the third conductive layer 140 may be provided in a stacked structure including at least one of Ti/Al/Ti, Mo/Al/Mo, Mo/AlGe/Mo, Ti/Cu, and the like, for example.

Although not shown, the first conductive layer 120 may further include connection lines respectively corresponding to the plurality of panel pads in the thickness direction. The connection lines may be disposed to respectively overlap the plurality of panel pads in the thickness direction. A width of each of the connection lines in the first direction DR1 may be smaller than a width of each of the plurality of panel pads in the first direction DR1 but is not limited thereto.

The first panel signal line PAD1 may be electrically connected to a first lead signal line LE1 of the first circuit board 300. The plurality of panel pads may further include a second panel signal line PAD2 and a third panel signal line PAD3, and the plurality of circuit pads may further include a second lead signal line LE2 and a third lead signal line LE3. The second panel signal line PAD2 and the second lead signal line LE2 may be electrically connected each other like the above, and the third panel signal line PAD3 and the third lead signal line LE3 may be electrically connected each other.

Although not shown, the above-described second insulation layer 112 may be disposed between the panel signal lines PAD1 to PAD3 and the connection lines. The panel signal lines PAD1 to PAD3 and the connection lines may respectively contact each other through at least one contact hole of the second insulation layer 112. Although not shown, the connection lines may be electrically connected to TFTs of pixels in the display area DA.

As described above, the third insulation layer 113 is disposed on the second conductive layer 130, and the third insulation layer 113 and structures disposed on the second conductive layer 130 in the panel pad area P_PA may be omitted or removed. Accordingly, the omitted or removed structures may expose the plurality of panel pads disposed in the panel pad area P_PA.

As will be described later, the lead signal lines LE1 to LE3 may be respectively coupled to the exposed panel signal lines PAD1 to PAD3, and lead dummy lines D_LE1 and D_LE2 may be coupled to exposed panel dummy lines D_PAD1 and D_PAD2. In one embodiment, the lead signal lines LE1 to LE3 and the panel signal lines PAD1 to PAD3 may be directly coupled to each other, respectively, through ultrasonic bonding without interposing an arbitrary configuration or a layer therebetween.

A first via layer 151 may be disposed on the third conductive layer 140. In an exemplary embodiment, the first via layer 151 may include an organic insulation material such as an acryl resin (polyacrylates resin), an epoxy resin, a phenolic resin, a polyamide resin, a polyimide resin, an unsaturated polyester resin, a polyphenylene ether resin, a polyphenylene sulfide resin, benzocyclobutene ("BCB"), or the like.

A fourth conductive layer 160 may be disposed on the first via layer 151. The fourth conductive layer 160 may include power voltage lines 161 and 163 and a connection electrode 162. The power voltage line 161 may be electrically connected to the source electrode 141 of the TFT through a contact hole passing through the first via layer 151. The connection electrode 162 may be electrically connected to the drain electrode 142 of the TFT through a contact hole passing through the first via layer 151. The power voltage line 163 may be electrically connected to the power voltage electrode 143 through a contact hole passing through the first via layer 151.

In an exemplary embodiment, the fourth conductive layer 160 may include a metal including at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo), for example. The fourth conductive layer 160 may be a single film but is not limited thereto and may be a multilayer film. In an exemplary embodiment, the fourth conductive layer 160 may be provided in a stacked structure including at least one of Ti/Al/Ti, Mo/Al/Mo, Mo/AlGe/Mo, Ti/Cu, and the like, for example.

A second via layer 152 may be disposed on the fourth conductive layer 160. The second via layer 152 may include the exemplified materials constituting the first via layer 151. In an exemplary embodiment, the second via layer 152 may include an organic insulation material such as an acryl resin, an epoxy resin, a phenolic resin, a polyamide resin, a polyimide resin, an unsaturated polyester resin, a polyphenylene ether resin, a polyphenylene sulfide resin, benzocyclobutene ("BCB"), or the like.

An anode electrode ANO is disposed on the second via layer 152. The anode electrode ANO may be electrically connected to the connection electrode 162 through a contact hole passing through the second via layer 152.

A pixel definition film PDL may be disposed on the anode electrode ANO. The pixel definition film PDL may include an opening that exposes the anode electrode ANO. The pixel definition film PDL may include an organic insulation material or an inorganic insulation material. In an exemplary embodiment, the pixel definition film PDL may include a material such as a photoresist, polyimide resin, an acryl resin, a silicon compound, a polyacryl resin, or the like.

The organic layer EL may be disposed on an upper surface of the anode electrode ANO and in the opening of the pixel definition film PDL. A cathode electrode CAT is disposed on the organic layer EL and the pixel definition film PDL. The cathode electrode CAT may be a common electrode disposed over a plurality of pixels.

A thin film encapsulation layer 170 is disposed on the cathode electrode CAT. The thin film encapsulation layer 170 may cover an organic light emitting device ("OLED"). The thin film encapsulation layer 170 may be a stacked film in which inorganic films and organic films are alternately stacked. In an exemplary embodiment, the thin film encapsulation layer 170 may include a first inorganic film 171, an organic film 172, and a second inorganic film 173 which are sequentially stacked, for example.

As described above, the first circuit board 300 may be disposed on the panel pad area P_PA of the display panel 100. Since one end of the first circuit board 300 is attached to the panel pad area P_PA and bent to surround one side surface of the base substrate 101, the other end of the first circuit board 300 may be disposed to overlap the lower surface of the panel lower sheet 200. The first circuit board 300 may include a base film 310 and various elements disposed on one surface of the base film 310.

The other end of the first circuit board 300 may be connected to the second circuit board 400. The second circuit board 400 may be attached to the lower surface of the panel lower sheet 200.

Referring to FIGS. 4 and 5, the panel signal lines PAD1 to PAD3, the panel align marks P_AM1 and P_AM2, and the panel dummy lines D_PAD1 and D_PAD2 may be disposed on the panel pad area P_PA. The panel signal lines PAD1 to PAD3, the panel align marks P_AM1 and P_AM2, and the panel dummy lines D_PAD1 and D_PAD2 may each be provided in plural.

The display panel 100 may include first signal lines $L_1$ connecting the panel signal lines PAD1 to PAD3 and the panel dummy lines D_PAD1 and D_PAD2 to the display area DA. The first signal lines $L_1$ may be the connection lines of the above-described first conductive layer 120. The panel signal lines PAD1 to PAD3, the panel dummy lines D_PAD1 and D_PAD2, and the panel align marks P_AM1 and P_AM2 may be arranged along the first direction DR1.

As shown in FIG. 4, the panel align marks P_AM1 and P_AM2 may be respectively disposed at one side and the other side of the panel pad area P_PA in the first direction DR1. The first panel signal line PAD1 may be disposed between the first panel align mark P_AM1 and the second panel align mark P_AM2, the second panel signal line PAD2 may be disposed between the first panel signal line PAD1 and the second panel align mark P_AM2, the third panel signal line PAD3 may be disposed between the first panel signal line PAD1 and the second panel signal line PAD2, the first panel dummy line D_PAD1 may be disposed between the first panel signal line PAD1 and the first panel align mark P_AM1, and the second panel dummy line D_PAD2 may be disposed between the second panel align mark P_AM2 and the second panel signal line PAD2.

The first panel dummy line D_PAD1 and the first panel align mark P_AM1 may be physically connected to each other, and the second panel dummy line D_PAD2 and the second panel align mark P_AM2 may be physically connected to each other.

Each of the first panel dummy line D_PAD1 and the first panel signal line PAD1 may have a shape that extends in an upper rightward direction and then extends in the second direction DR2 in the drawing, each of the second panel dummy line D_PAD2 and the second panel signal line PAD2 may have a shape that extends in an upper leftward direction and then extends in the second direction DR2, and the third panel signal line PAD3 may have a shape that extends in the second direction DR2.

Generally, each of the first panel align mark P_AM1 and the second panel align mark P_AM2 may have a shape that extends in the first direction DR1.

The shapes of the above-described panel pads are not limited thereof, and each of the panel pads may have various shapes.

The panel dummy lines D_PAD1 and D_PAD2 are connected to the first signal lines $L_1$ but may be dummy lines to which electrical signals are not applied from the external first circuit board 300. In some exemplary embodiments, the panel dummy lines D_PAD1 and D_PAD2 may be provided as floating electrodes not connected to the first signal lines $L_1$.

As shown in FIG. 5, on the first circuit area CA1, the plurality of circuit pads, second signal lines $L_2$ electrically connecting some of the plurality of circuit pads and the data driving IC 390, and third signal lines $L_3$ electrically connecting the data driving IC 390 and connection pads C_PAD electrically connected to the second circuit board 400 (refer to FIG. 1) may be included.

The plurality of circuit pads may include lead align marks L_AM1 and L_AM2, lead dummy lines D_LE1 to D_LE4, and the lead signal lines LE1 to LE3. The lead align marks L_AM1 and L_AM2, the lead dummy lines D_LE1 to D_LE4, and the lead signal lines LE1 to LE3 may each be provided in plural.

The lead align marks L_AM1 and L_AM2 may be respectively disposed at one side and the other side of the first circuit board 300 in the first direction DR1. The first lead signal line LE1 may be disposed between the first lead align mark L_AM1 and the second lead align mark L_AM2, the second lead signal line LE2 may be disposed between the first lead signal line LE1 and the second lead align mark L_AM2, the third lead signal line LE3 may be disposed between the first lead signal line LE1 and the second lead signal line LE2, the first lead dummy line D_LE1 may be disposed between the first lead signal line LE1 and the first lead align mark L_AM1, the second lead dummy line D_LE2 may be disposed between the second lead align mark L_AM2 and the second lead signal line LE2, the third lead dummy line D_LE3 may be disposed between the first lead dummy line D_LE1 and the first lead signal line LE1, and the fourth lead dummy line D_LE4 may be disposed between the second lead dummy line D_LE2 and the second lead signal line LE2.

Each of the first lead signal line LE1, the first lead dummy line D_LE1, and the third lead dummy line D_LE3 may have a shape that extends in the second direction DR2 from a lower side and then is bent in an upper leftward direction in the drawing, each of the second lead signal line LE2, the second lead dummy line D_LE2, and the fourth lead dummy line D_LE4 may have a shape that extends in the second direction DR2 from a lower side and then is bent in an upper rightward direction in the drawing, and the third lead signal line LE3 may have a shape that extends in the second direction DR2.

The lead align marks L_AM1 and L_AM2 may include one or more patterns passing therethrough in the thickness direction from surfaces thereof. The at least one pattern may be provided in plural. In FIG. 5, each of the number of patterns in the first lead align mark L_AM1 and the number of patterns in the second lead align mark L_AM2 is illustrated as three but may also be two or four or more.

A first pattern of the first lead align mark L_AM1 may include first indented patterns IDP1. Each of the first indented patterns IDP1 may have a shape that extends from one end of the first lead align mark L_AM1 in the second direction DR2 along the second direction DR2 and then is bent in an upper leftward direction in the drawing in a plan view. The first indented patterns IDP1 may not extend to the other end of the first lead align mark L_AM1 in the second direction DR2 and may terminate in the first lead align mark L_AM1 in a plan view.

A second pattern of the second lead align mark L_AM2 may include second indented patterns IDP2. Each of the second indented patterns IDP2 may have a shape that extends from one end of the second lead align mark L_AM2 in the second direction DR2 along the second direction DR2 and then is bent in an upper rightward direction in the drawing in a plan view. The second indented patterns IDP2 may not extend to the other end of the second lead align mark L_AM2 in the second direction DR2 and may terminate in the second lead align mark L_AM2 in a plan view.

As described above, since the lead align marks L_AM1 and L_AM2 include the indented patterns IDP1 and IDP2 passing therethrough in the thickness direction, respectively, as will be described later, when the underfill resin UR is filled after a process of bonding the display panel 100 and the first circuit board 300 is completed, the lead align marks L_AM1 and L_AM2 may be more easily filled with the underfill resin UR. Accordingly, the display panel 100 and the first circuit board 300 may be more easily attached.

The lead dummy lines D_LE1 to D_LE4 are connected to the second signal lines $L_2$ but may be dummy lines to which electrical signals are not applied from the data driving IC 390. In some exemplary embodiments, the lead dummy lines D_LE1 to D_LE4 may be provided as floating electrodes not connected to the second signal lines $L_2$.

Referring to FIG. 6, the first panel signal line PAD1 may correspond to the first lead signal line LE1 in the thickness direction and be disposed to overlap the first lead signal line LE1, the second panel signal line PAD2 may correspond to the second lead signal line LE2 in the thickness direction and be disposed to overlap the second lead signal line LE2, the third panel signal line PAD3 may correspond to the third lead signal line LE3 in the thickness direction and be disposed to overlap the third lead signal line LE3, the first panel dummy line D_PAD1 may correspond to the third lead dummy line D_LE3 in the thickness direction and be disposed to overlap the third lead dummy line D_LE3, and the second panel dummy line D_PAD2 may correspond to the fourth lead dummy line D_LE4 in the thickness direction and be disposed to overlap the fourth lead dummy line D_LE4. In a plan view, the first panel dummy line D_PAD1 may be disposed between the first panel signal line PAD1 and the first lead align mark L_AM1, the second panel dummy line D_PAD2 may be disposed between the second panel signal line PAD2 and the second lead align mark L_AM2. The first lead dummy line D_LE1 may be disposed to partially overlap the first panel align mark P_AM1 in a plan view, and the second lead dummy line D_LE2 may be disposed to partially overlap the second panel align mark P_AM2 in a plan view.

The panel signal lines PAD1 to PAD3 and the lead signal lines LE1 to LE3 may be directly connected, respectively. The panel signal lines PAD1 to PAD3 and the lead signal lines LE1 to LE3 may be ultrasonically bonded, respectively.

Each of the circuit pads may include a metallic material. In an exemplary embodiment, each of the circuit pads may include a metal including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), for example. Each of the circuit pads may be a single film or a stacked film including the exemplified materials.

Referring back to FIG. 2, the ultrasonic bonding may be performed by an ultrasonic device 500.

As shown in FIG. 3, the ultrasonic device 500 may include a vibration generation part 510, a vibration part 520 connected to the vibration generation part 510, a pressing part 530 amplifying a vibration amplitude of the vibration part 520, and a vibration transmission part 540 connected to the vibration part 520.

The vibration generation part 510 may convert electrical energy into vibration energy. The vibration part 520 may vibrate using the vibration energy converted in the vibration generation part 510. The vibration part 520 may vibrate with a predetermined vibrating direction and a predetermined amplitude. The amplitude of the vibration part 520 may be amplified in a direction parallel to the vibrating direction through the pressing part 530 connected to the vibration part 520. The vibration transmission part 540 may transmit vibration of the vibration part 520 to an object to be ultrasonically bonded. A support part 550 may fix an upper surface and a lower surface of the vibration part 520 to restrain the vibration part 520 and the vibration transmission part 540 from vertically shifting due to the vibration.

In one embodiment, the ultrasonic device 500 contacts the other surface of the first circuit board 300 and maintains a predetermined pressurization state in a downward direction so that the vibration transmission part 540 efficiently transmits the vibration to the first circuit board 300. In this case, the vibration transmission part 540 of the ultrasonic device 500 may overlap an entire area of the first circuit board 300 disposed thereunder to perform the ultrasonic bonding.

The ultrasonic device 500 may vibrate the first lead signal line LE1 in a predetermined vibrating direction while vibrating in the predetermined vibrating direction. However, in this case, the panel signal line PAD may slightly vibrate in the vibrating direction due to the vibration transmitted through the first lead signal line LE1, but the vibration amplitude may be slight. Accordingly, the vibration amplitude of the vibration transmission part 540 in the vibrating direction may be substantially the same as a distance in which the first lead signal line LE1 moves in the vibrating direction on the panel signal line PAD. In one embodiment, the vibrating direction may be the second direction DR2. That is, the vibrating direction may be a direction in which long sides of the panel signal lines PAD1 to PAD3 and the lead signal lines LE1 to LE3 extend.

In descriptions of the first panel signal line PAD1 and the first lead signal line LE1 as examples, when the first lead signal line LE1 is ultrasonically vibrated on one surface of the first panel signal line PAD1, a predetermined friction force may be generated from an interface between one surface of the first panel signal line PAD1 and one surface of the first lead signal line LE1, and friction heat may be generated due to the friction force. When the friction heat is sufficient to melt materials forming the first panel signal line PAD1 and the first lead signal line LE1, a panel melting area of the first panel signal line PAD1 adjacent to the first lead signal line LE1 and a lead melting area of the first lead signal line LE1 adjacent to the first panel signal line PAD1 may be melted. That is, the first panel signal line PAD1 may include a panel non-melting area and the panel melting area. Further, the first lead signal line LE1 may include a lead non-melting area and the lead melting area.

The panel non-melting area may be an area including only materials included in the first panel signal line PAD1. The lead non-melting area may be an area including only materials included in the first lead signal line LE1.

The first panel signal line PAD1 and the first lead signal line LE1 may be respectively solidified at the panel melting area and the lead melting area and then coupled to each other.

The interface between the first panel signal line PAD1 and the first lead signal line LE1, that is, the interface between the panel melting area and the lead melting area, may have an uneven shape.

As shown in FIG. 6, the lead align marks L_AM1 and L_AM2 may include indented portions which are indented inward from the other ends thereof in the second direction DR2. The panel align marks P_AM1 and P_AM2 may be respectively disposed on the indented portion of the lead align marks L_AM1 and L_AM2 but are not limited thereto.

As shown in FIG. 6, the underfill resin UR may be disposed on the panel pad area P_PA. The underfill resin UR may be disposed to overlap the above-described plurality of panel pads and circuit pads in the thickness direction in a plan view. The underfill resin UR may include an insulation resin. A space between the base substrate 101 and the first circuit board 300 may be filled with the insulation resin through an end of the panel pad area P_PA in a plan view after the process of bonding the display panel 100 and the first circuit board 300 is completed, as will be described later.

Referring to FIG. 7, the underfill resin UR may directly contact surfaces of the first lead align mark L_AM1 and may be disposed between the first insulation layer 111 of the display panel 100 and the base film 310. As shown in FIG. 7, the underfill resin UR may be arranged on an end of the display panel 100 in the thickness direction but is not limited thereto and may be disposed to protrude more in an outward direction from the end of the display panel 100.

Referring to FIG. 8, the underfill resin UR may contact surfaces of the first lead align mark L_AM1 (one surface facing the display panel 100 and side surfaces), surfaces of the first lead dummy line D_LE1 (one surface facing the display panel 100 and side surfaces), side surfaces of each of the third lead dummy line D_LE3 and the first panel dummy line D_PAD1, and side surfaces of each of the first lead signal line LE1 and the first panel signal line PAD1.

Figure 9:
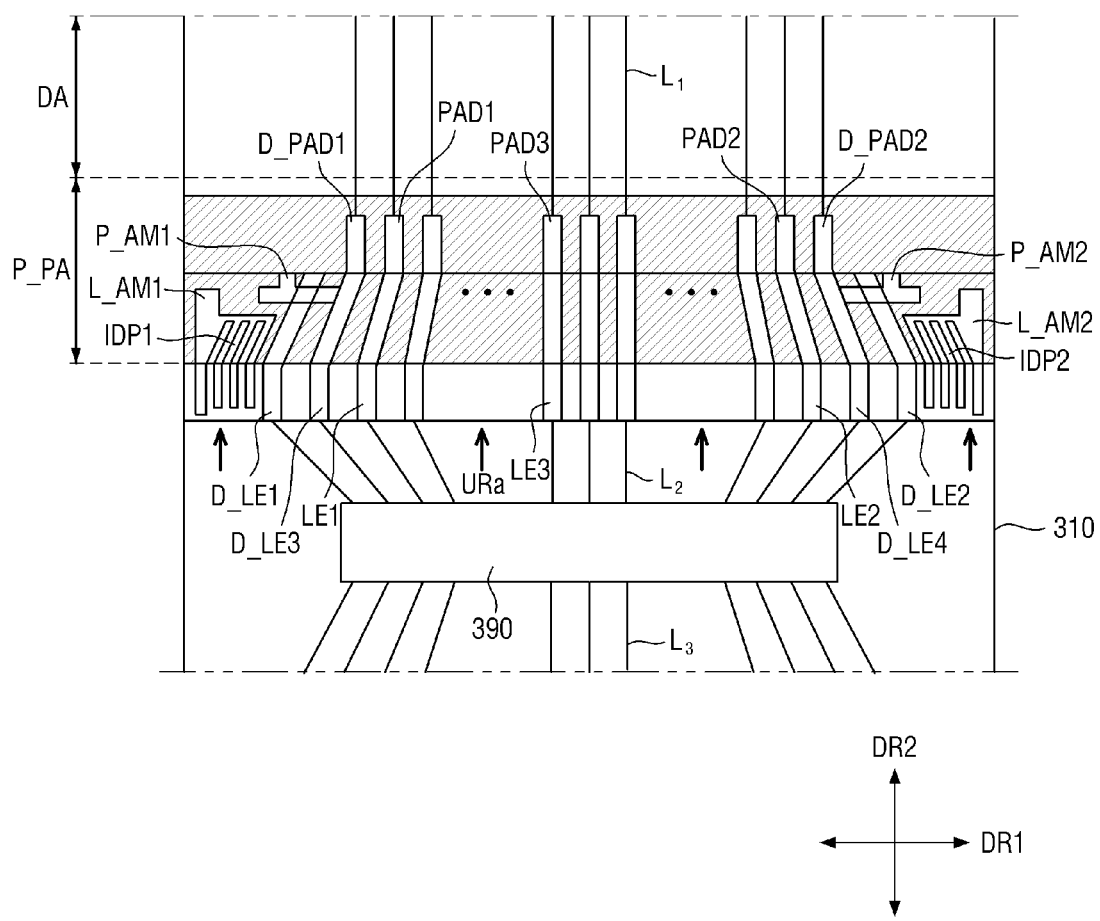
FIGS. 9 and 10 are views illustrating another exemplary embodiment of a process of filling an underfill resin material.
Figure 10:
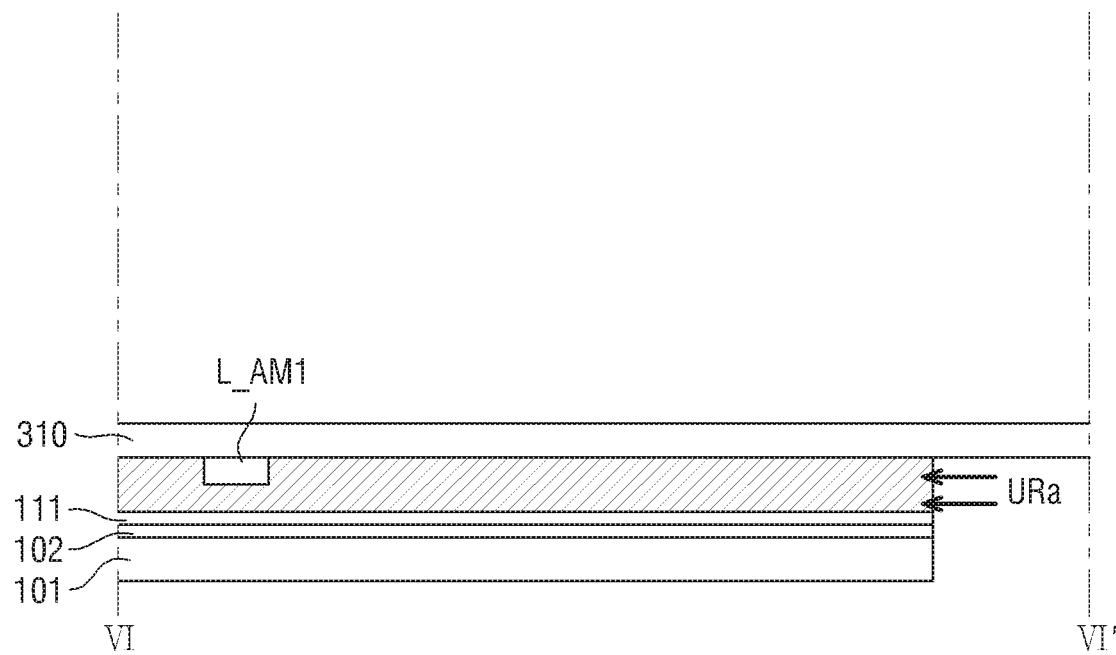

FIGS. 9 and 10 are views illustrating a process of filling an underfill resin material.

Referring to FIGS. 9 and 10, an underfill resin material URa may be a material before the above-described underfill resin UR is hardened. As shown in FIGS. 9 and 10, the underfill resin material URa may be filled from the end of the panel pad area P_PA.

The indented patterns IDP1 and IDP2 of the lead align marks L_AM1 and L_AM2 may be arranged with the end of the panel pad area P_PA in the thickness direction.

A space between the base film 310 and the first insulation layer 111 may be filled with the underfill resin material URa.

As described above, since the lead align marks L_AM1 and L_AM2 include the indented patterns IDP1 and IDP2 passing therethrough in the thickness direction, as will be described later, when the underfill resin UR fills therein after the process of bonding the display panel 100 and the first circuit board 300 is completed, the lead align marks L_AM1 and L_AM2 may be more easily filled with the underfill resin UR. Accordingly, the display panel 100 and the first circuit board 300 may be more easily attached.

Hereinafter, a display device in another exemplary embodiment will be described. In the following exemplary embodiments, components the same as those in the above-described embodiment will be referred to with the same reference numerals, and descriptions of the components will be omitted or simplified.

Figure 11:
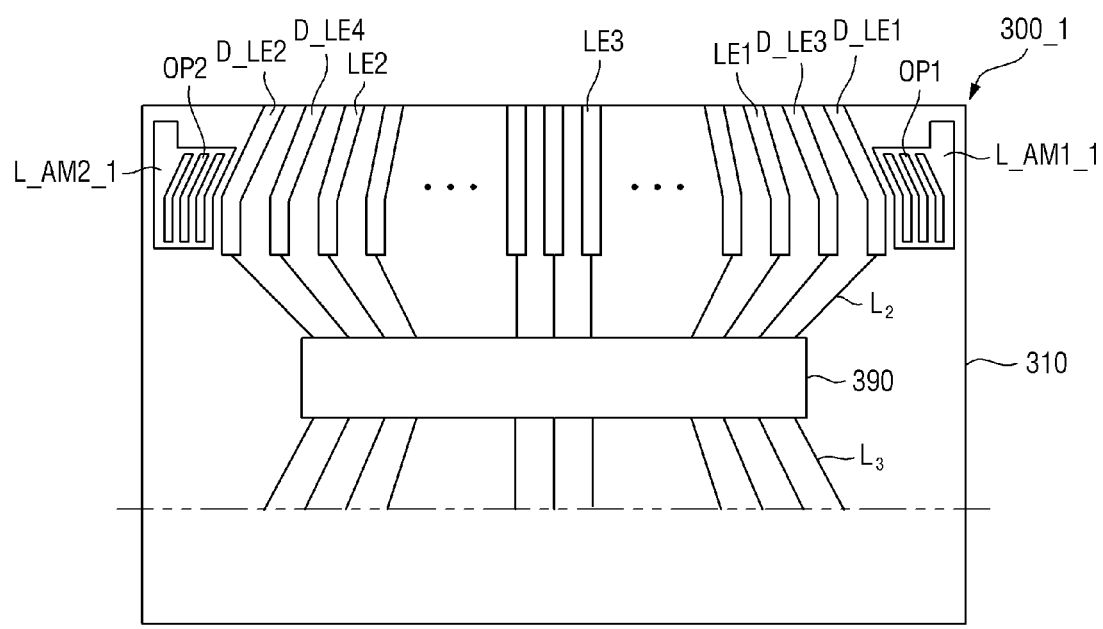
FIG. 11 is a plan view of another exemplary embodiment of a first circuit board.
Figure 12:
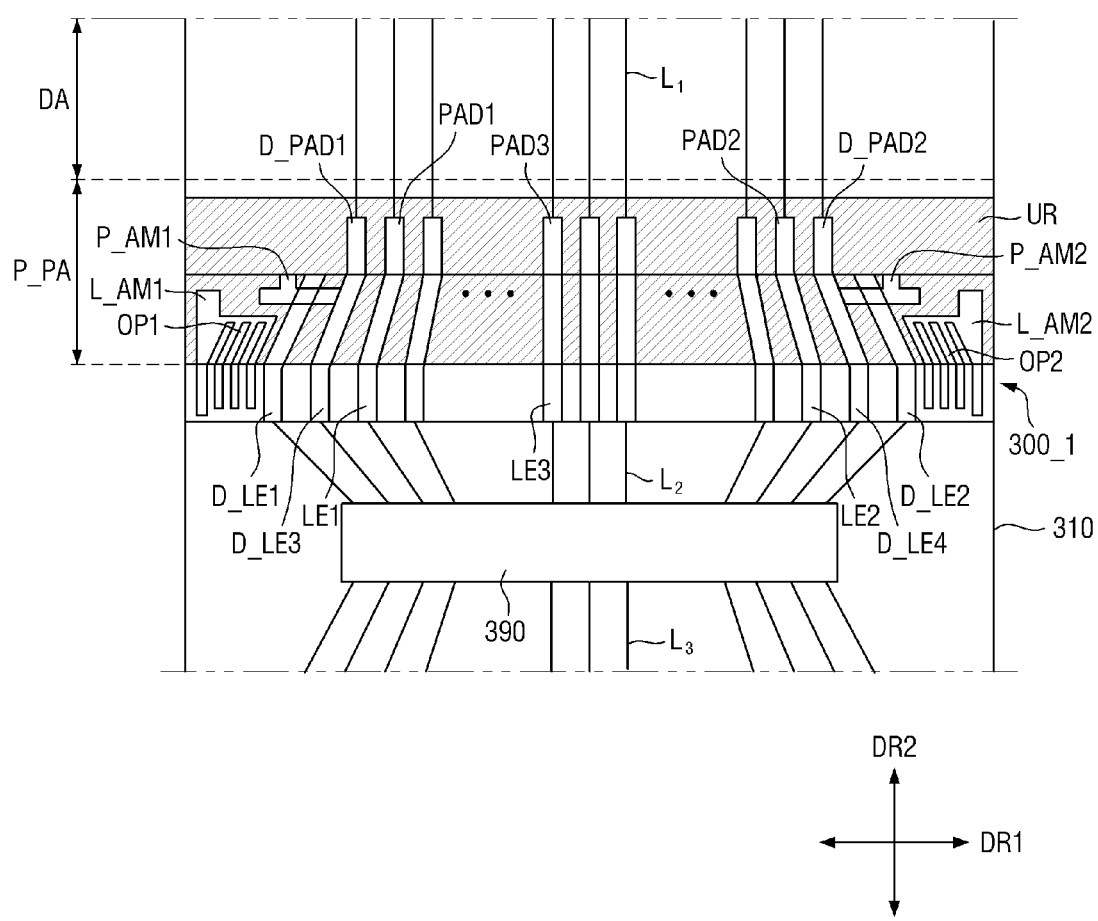
FIG. 12 is a plan view illustrating another exemplary embodiment of a state in which the first circuit board is attached to a panel pad area of a display panel.

FIG. 11 is a plan view of another exemplary embodiment of a first circuit board, and FIG. 12 is a plan view illustrating another exemplary embodiment of a state in which the first circuit board is attached to a panel pad area of a display panel.

Referring to FIGS. 11 and 12, a display device in the exemplary embodiment has a difference in that shapes of lead align marks L_AM1_1 and L_AM2_1 of a first circuit board 300_1 are different from those of the first circuit board 300 of the display device.

More specifically, the first circuit board 300_1 may include a first lead align mark L_AM1_1 and a second lead align mark L_AM2_1.

The lead align marks L_AM1_1 and L_AM2_1 may include at least one pattern passing therethrough in the thickness direction from surfaces thereof. The at least one pattern may be provided in plural. In FIG. 11, each of the number of patterns in the first lead align mark L_AM1_1 and the number of patterns in the second lead align mark L_AM2_1 is illustrated as three but may also be two or four or more.

First open parts OP1 may be defined in a first pattern of the first lead align mark L_AM1_1. The first open parts OP1 may be defined between one end and the other end of the first lead align mark L_AM1_1 in the second direction DR2 in a plan view. The first open parts OP1 may be completely surrounded by a material constituting the first lead align mark L_AM1_1. Each of the first open parts OP1 may have a shape that extends in the second direction DR2 and then is bent in an upper leftward direction in the drawing.

Second open parts OP2 may be defined in a second pattern of the second lead align mark L_AM2_1. The second open parts OP2 may be defined between one end and the other end of the second lead align mark L_AM2_1 in the second direction DR2 in a plan view. The second open parts OP2 may be completely surrounded by a material constituting the second lead align mark L_AM2_1. Each of the second open parts OP2 may have a shape that extends in the second direction DR2 and then is bent in an upper rightward direction in the drawing.

Since the open parts OP1 and OP2 passing therethrough in the thickness direction are defined in the lead align marks L_AM1_1 and L_AM2_1, respectively, when the underfill resin UR fills therein after a process of bonding the display panel 100 and the first circuit board 300_1 is completed, the lead align marks L_AM1_1 and L_AM2_1 may be more easily filled with the underfill resin UR. Accordingly, the display panel 100 and the first circuit board 300_1 may be more easily attached.

Figure 13:
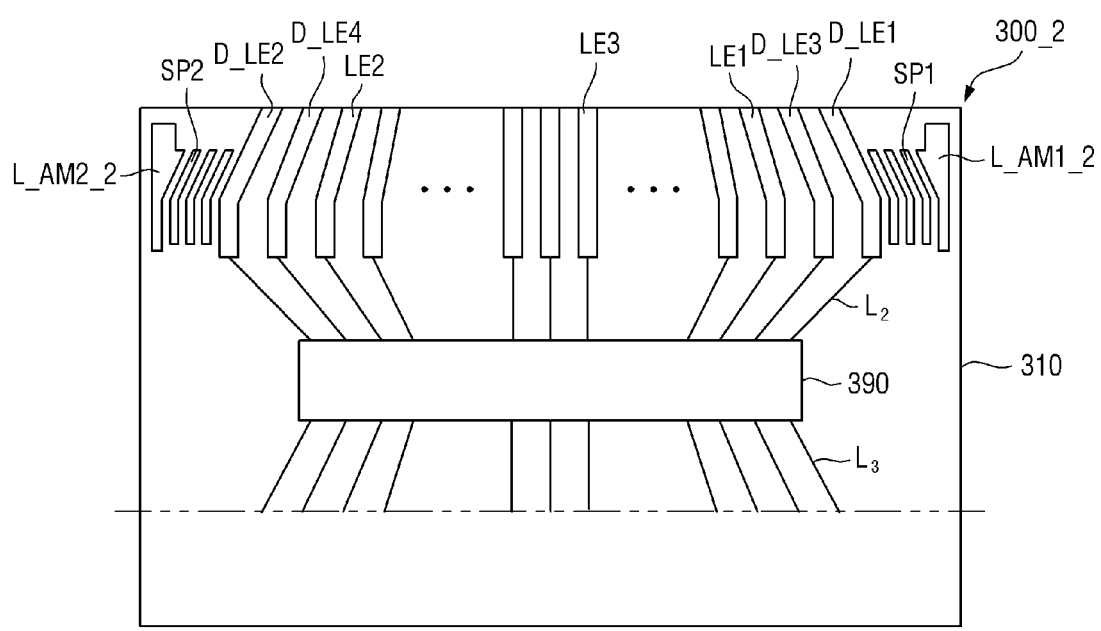
FIG. 13 is a plan view of another exemplary embodiment a first circuit board.
Figure 14:
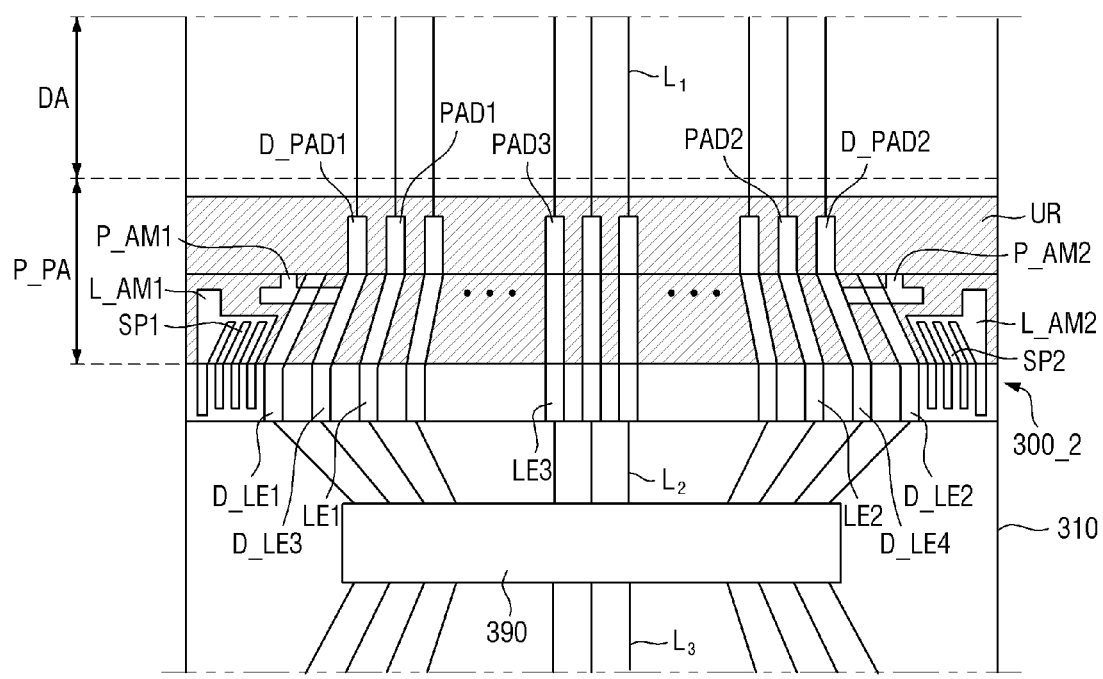
FIG. 14 is a plan view illustrating another exemplary embodiment of a state in which the first circuit board is attached to a panel pad area of a display panel.

FIG. 13 is a plan view of another exemplary embodiment of a first circuit board, and FIG. 14 is a plan view illustrating another exemplary embodiment of a state in which the first circuit board is attached to a panel pad area of a display panel.

Referring to FIGS. 13 and 14, a display device in the exemplary embodiment has a difference in that shapes of lead align marks L_AM1_2 and L_AM2_2 of a first circuit board 300_2 are different from those of the first circuit board 300 of the display device.

More specifically, the first circuit board 300_2 may include a first lead align mark L_AM1_2 and a second lead align mark L_AM2_2.

One or more separation spaces SP1 and SP2 passing therethrough in the thickness direction from surfaces thereof may be defined in the lead align marks L_AM1_2 and L_AM2_2. Each of the one or more separation spaces SP1 and SP2 may be provided in plural. In FIG. 13, each of the number of first separation spaces SP1 and the number of second separation spaces SP2 is illustrated as three but may also be two or four or more.

The first lead align mark L_AM1_2 may include separation patterns disposed to be spaced apart from each other in the first direction DR1 with the first separation spaces SP1 therebetween.

Each of the first separation spaces SP1 of the first lead align mark L_AM1_2 may have a shape that extends from one end of the first lead align mark L_AM1_2 to the other end of the first lead align mark L_AM1_2 in the second direction DR2. That is, the first separation spaces SP1 may completely cross one end of the first lead align mark L_AM1_2 to the other end of the first lead align mark L_AM1_2. Each of the first separation spaces SP1 may have a shape that extends from one end of the first lead align mark L_AM1_2 along the second direction DR2 and then is bent in an upper leftward direction in the drawing.

The second lead align mark L_AM2_2 may include separation patterns disposed to be spaced apart from each other in the first direction DR1 with the second separation spaces SP2 therebetween.

Each of the second separation spaces SP2 of the second lead align mark L_AM2_2 may have a shape that extends from one end of the second lead align mark L_AM2_2 to the other end of the second lead align mark L_AM2_2 in the second direction DR2. That is, the second separation spaces SP2 may completely cross one end of the second lead align mark L_AM2_2 to the other end of the second lead align mark L_AM2_2. Each of the second separation spaces SP2 may have a shape that extends from one end of the second lead align mark L_AM2_2 along the second direction DR2 and then is bent in an upper rightward direction in the drawing.

Since the separation spaces SP1 and SP2 passing therethrough in the thickness direction are defined in the lead align marks L_AM1_2 and L_AM2_2, when the underfill resin UR fills therein after a process of bonding the display panel 100 and the first circuit board 300_2 is completed, the align marks L_AM1_2 and L_AM2_2 may be more easily filled with the underfill resin UR. Accordingly, the display panel 100 and the first circuit board 300_2 may be more easily attached.

Figure 15:
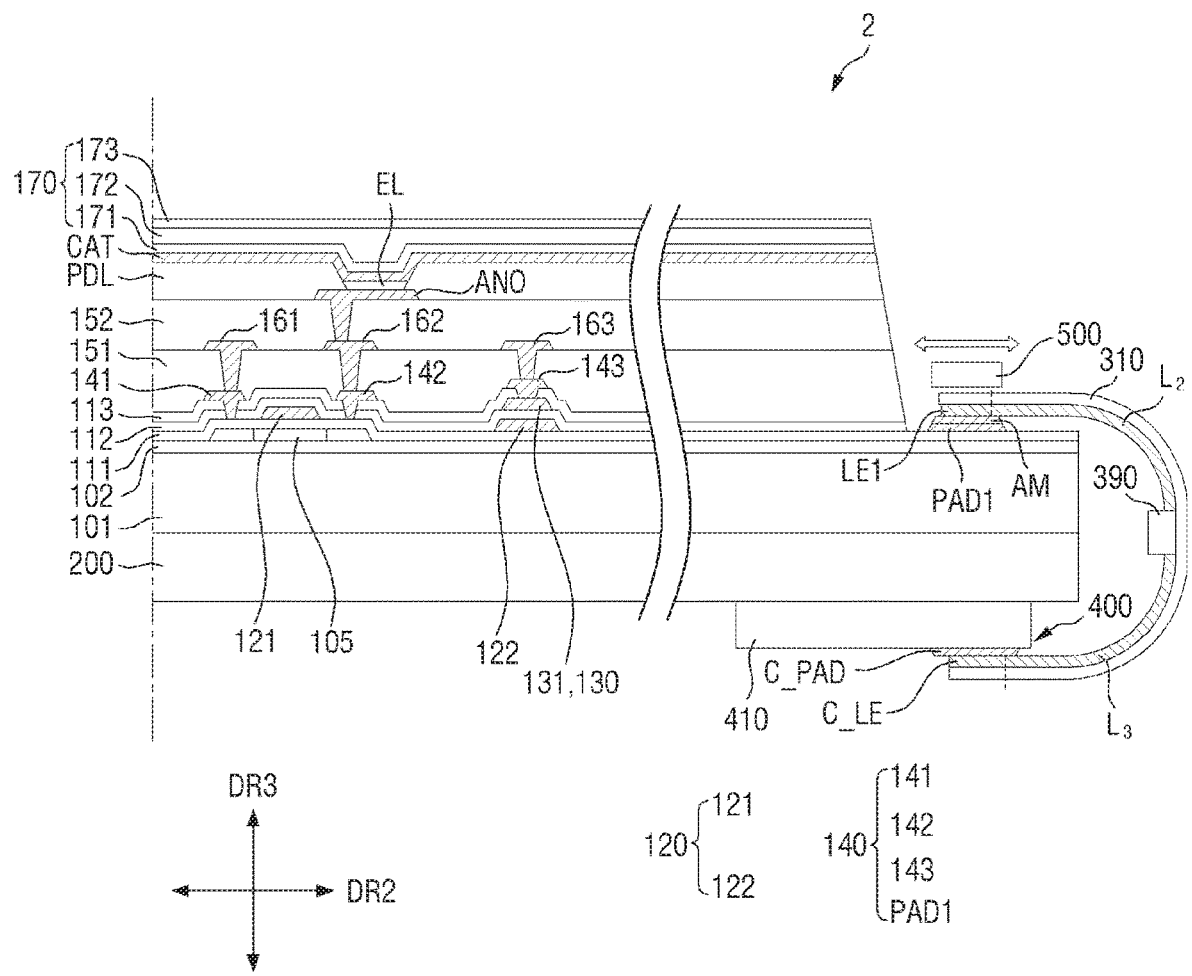
FIG. 15 is a cross-sectional view of another exemplary embodiment of a display device.
Figure 16:
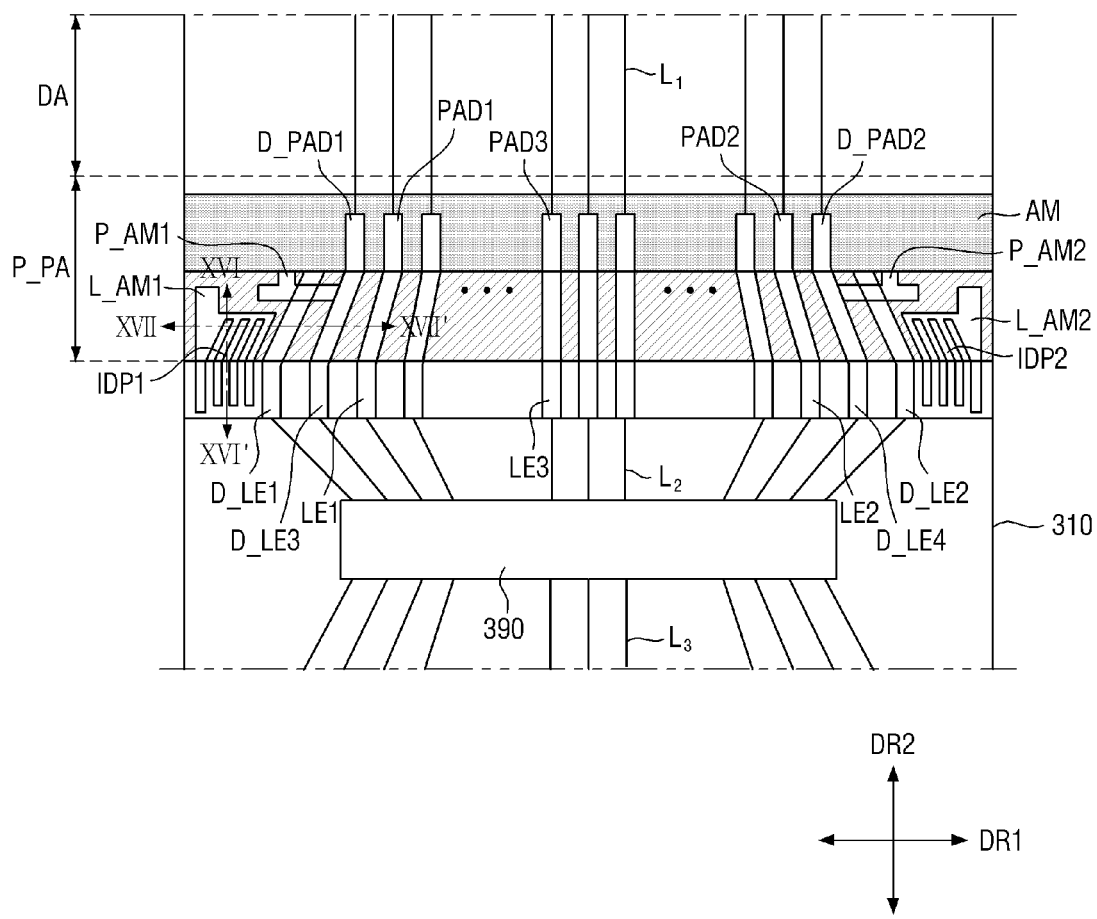
FIG. 16 is a plan view illustrating another exemplary embodiment of a state in which a first circuit board is attached to a panel pad area of a display panel.
Figure 17:
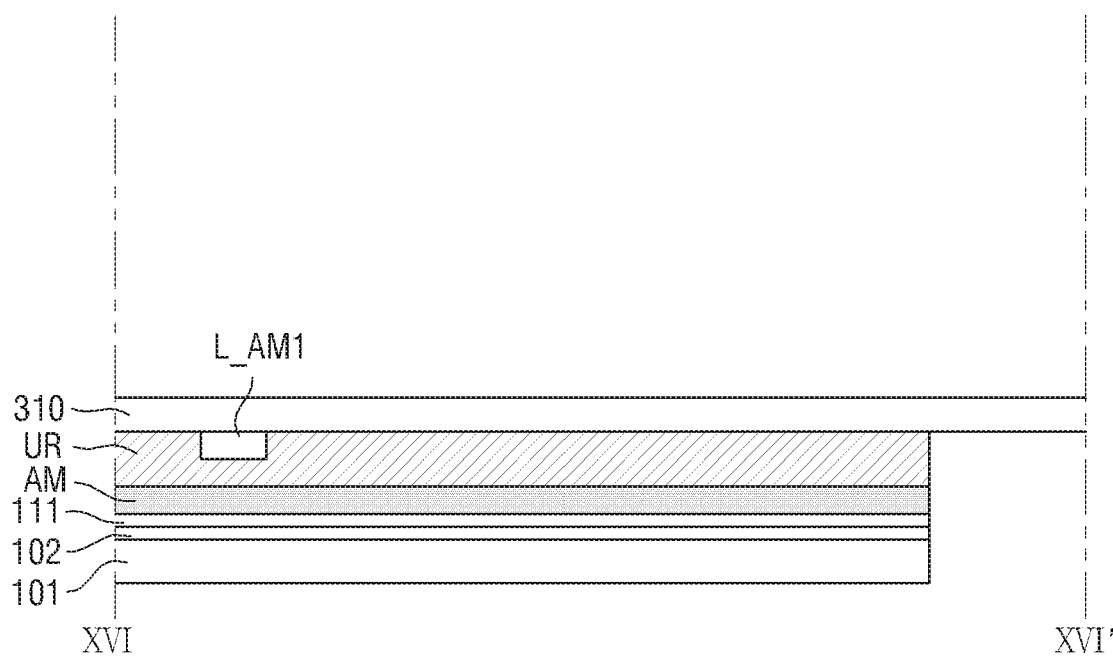
FIG. 17 is a cross-sectional view taken along line XVI-XVI' in FIG. 16.
Figure 18:
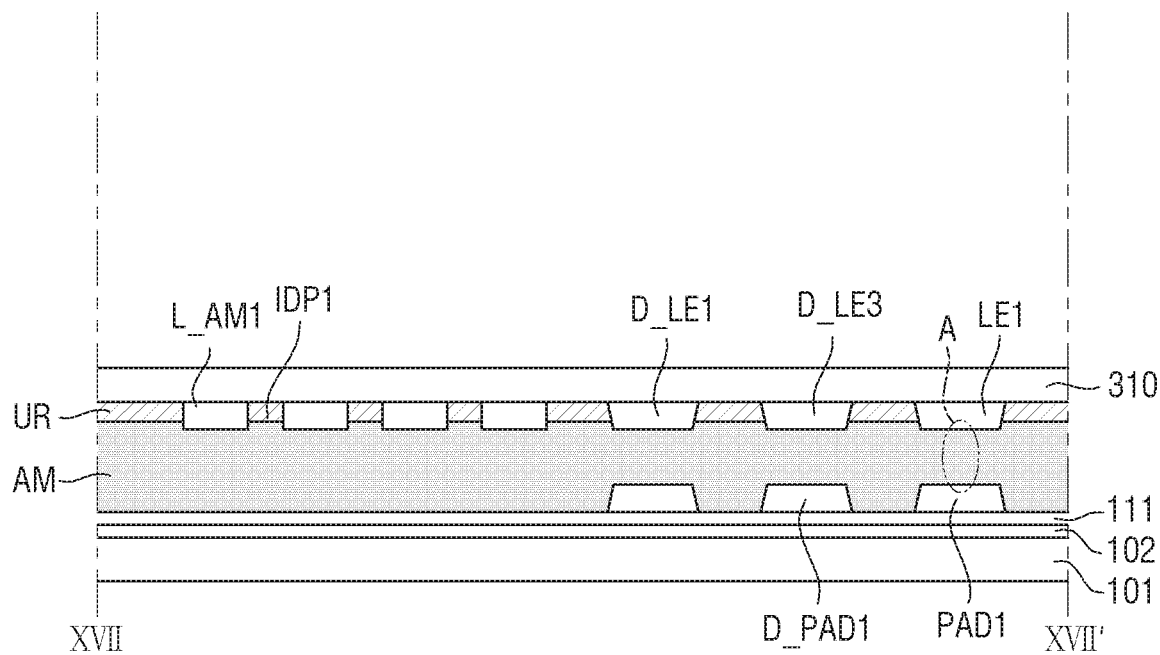
FIG. 18 is a cross-sectional view taken along line XVII-XVII' in FIG. 16.
Figure 19:
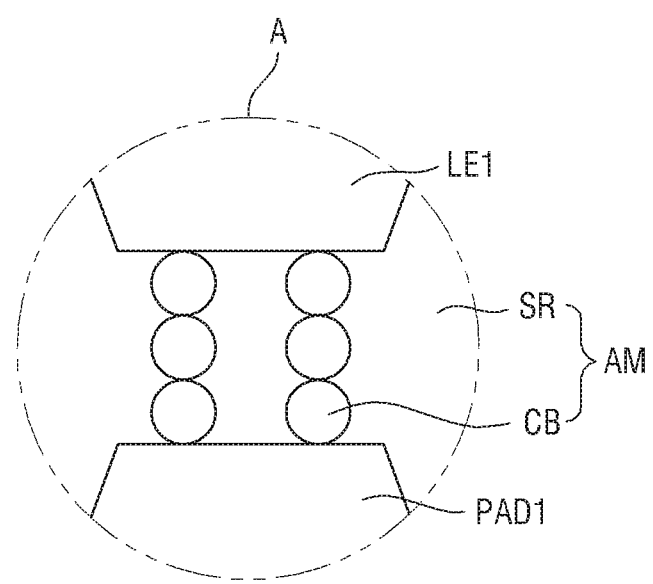
FIG. 19 is an enlarged view of area A in FIG. 18.

FIG. 15 is a cross-sectional view of another exemplary embodiment of a display device, FIG. 16 is a plan view illustrating another exemplary embodiment of a state in which a first circuit board is attached to a panel pad area of a display panel, FIG. 17 is a cross-sectional view taken along line XVI-XVI' in FIG. 16, FIG. 18 is a cross-sectional view taken along line XVII-XVII' in FIG. 16, and FIG. 19 is an enlarged view of area A in FIG. 18.

Referring to FIGS. 15 to 19, a display device 2 in the exemplary embodiment is different from the display device 1 in that a first panel signal line PAD1 and a first lead signal line LE1 are not directly connected to each other and are electrically connected to each other through a coupling member AM.

More specifically, the coupling member AM may be disposed on a panel pad area P_PA (refer to FIG. 1). FIG. 16 illustrates that the size of the coupling member AM in a plan view is the same as that of the underfill resin UR but the invention is not limited thereto.

Referring to FIG. 17, the coupling member AM may be disposed between the underfill resin UR and a display panel 100 (refer to FIG. 1). The coupling member AM may directly contact the underfill resin UR and an insulation layer of the display panel 100.

Referring to FIG. 18, the coupling member AM may be disposed between a first lead signal line LE1 and a first panel signal line PAD1, between a third lead dummy line D_LE3 and a first panel dummy line D_PAD1, and between a first lead dummy line D_LE1 and a first lead align mark L_AM1 and the insulation layer of the display panel 100.

As shown in FIG. 19, the coupling member AM may be disposed between the first panel signal line PAD1 and the first lead signal line LE1 and serve to electrically connect the first panel signal line PAD1 and the first lead signal line LE1. The coupling member AM may include conductive balls CB and a resin SR in which the conductive balls CB are dispersed. The resin SR may include an organic insulation material.

The underfill resin UR may contact side surfaces of the first lead align mark L_AM1 and fill the inside of each of first indented patterns IDP1.

Even in this exemplary embodiment, since the lead align marks L_AM1 and L_AM2 include indented patterns IDP1 and IDP2 passing therethrough in the thickness direction, when the underfill resin UR fills therein after the process of bonding the display panel 100 and the first circuit board 300 is completed, the lead align marks L_AM1 and L_AM2 may be more easily filled with the underfill resin UR. Accordingly, the display panel 100 and the first circuit board 300 may be more easily attached.

In exemplary embodiments of the invention, a display device capable of improving adhesion between a display panel and a flexible printed circuit board may be provided.

Effects according to the invention are not limited to the above, and further various effects are included in the specification.

As described above, although the exemplary embodiments of the invention are mainly described, the above are only examples and not intended to limit the invention, and those skilled in the art may perform modifications and applications which are not described above within the scope not departing from the essential characteristics of the invention. The elements specifically shown in the exemplary embodiments of the invention may be modified, for example. Further, differences related to the modifications and the applications should be included in the scope of the invention as defined in the claims.

What is claimed is:

1. A display device comprising:
a base substrate in which a display area and a pad area disposed around the display area are defined;
a plurality of panel pads disposed on the pad area of the base substrate; and
a printed circuit board attached to the pad area of the base substrate and including:
a plurality of circuit pads including:
a first lead align mark including a plurality of first patterns passing through the first lead align mark from a surface of the first lead align mark in a thickness direction,
wherein the plurality of circuit pads further includes a first lead signal line,
wherein the plurality of panel pads includes a first panel signal line which corresponds to the first lead signal line, a first panel dummy line which is disposed between the first panel signal line and the first lead align mark, and a first panel align mark which is physically connected to the first panel dummy line,
wherein the first lead signal line and the first panel signal line are electrically connected, and
wherein the first panel align mark is separated from the first lead align mark in a plan view.

2. The display device of claim 1, wherein the plurality of first patterns extends from a first end of the first lead align mark and terminates in the first lead align mark in the plan view.

3. The display device of claim 1, wherein the plurality of first patterns extends to a second end of the first lead align mark from a first end of the first lead align mark and completely crosses the first lead align mark in the plan view.

4. The display device of claim 1, wherein the plurality of first patterns is disposed in the first lead align mark and is completely surrounded by a material constituting the first lead align mark in the plan view.

5. The display device of claim 1, wherein:
the first lead signal line which extends in a first direction; and
the first panel signal line extends in the first direction.

6. The display device of claim 5, wherein:
the plurality of circuit pads further includes a second lead align mark spaced apart from the first lead align mark with the first lead signal line therebetween; and
the second lead align mark includes a plurality of second patterns passing through the second lead align mark from a surface of the second lead align mark in the thickness direction.

7. The display device of claim 6, wherein:
the plurality of circuit pads further includes a second lead signal line disposed between the first lead signal line and the second lead align mark;
the plurality of panel pads includes a second panel signal line corresponding to the second lead signal line; and
the second lead signal line and the second panel signal line are electrically connected.

8. The display device of claim 7, wherein:
the first panel dummy line extends in the first direction, and
the first panel align mark extends in a second direction which crosses the first direction in the plan view.

9. The display device of claim 5, wherein the first lead signal line and the first panel signal line are directly connected.

10. The display device of claim 9, wherein the first lead signal line and the first panel signal line are ultrasonically bonded.

11. The display device of claim 5, further comprising a coupling member disposed between the first lead signal line and the first panel signal line,
wherein the coupling member includes an anisotropic conductive film, and
the first lead signal line and the first panel signal line are electrically connected to each other by the anisotropic conductive film.

12. The display device of claim 1, further comprising a resin which is disposed between the printed circuit board and the base substrate and contacts surfaces of the plurality of panel pads and surfaces of the plurality of circuit pads,
wherein the resin contacts the first lead align mark and fills a first pattern of the plurality of first patterns of the first lead align mark.

13. A display device comprising:
a base substrate in which a display area and a pad area disposed around the display area are defined;
a plurality of panel pads disposed on the pad area of the base substrate; and
a printed circuit board attached to the pad area of the base substrate and including:
a plurality of circuit pads including:
a first lead align mark including a plurality of first patterns passing through the first lead align mark from a surface of the first lead align mark in a thickness direction,
wherein the plurality of circuit pads further includes a first lead signal line,
wherein the plurality of panel pads includes a first panel signal line which corresponds to the first lead signal line, a first panel dummy line which is disposed between the first panel signal line and the first lead align mark, and a first panel align mark which is physically connected to the first panel dummy line,
wherein the first lead signal line and the first panel signal line are electrically connected,
wherein:
the first lead signal line which extends in a first direction; and
the first panel signal line extends in the first direction,
wherein:
the plurality of circuit pads further includes a second lead align mark spaced apart from the first lead align mark with the first lead signal line therebetween; and
the second lead align mark includes a plurality of second patterns passing through the second lead align mark from a surface of the second lead align mark in the thickness direction,
wherein:
the plurality of circuit pads further includes a second lead signal line disposed between the first lead signal line and the second lead align mark;
the plurality of panel pads includes a second panel signal line corresponding to the second lead signal line; and
the second lead signal line and the second panel signal line are electrically connected,
wherein:
the first panel dummy line extends in the first direction, and
the first panel align mark extends in a second direction which crosses the first direction in the plan view,
wherein the plurality of panel pads further includes a second panel dummy line which is disposed between the second panel signal line and the second lead align mark and extends in the first direction, and a second panel align mark which is physically connected to the second panel dummy line and extends in the second direction in the plan view.

14. The display device of claim 13, wherein the plurality of circuit pads further includes a first lead dummy line corresponding to the first panel dummy line, and a second lead dummy line corresponding to the second panel dummy line.

15. The display device of claim 14, wherein the plurality of circuit pads further includes a third lead dummy line disposed between the first lead dummy line and the first lead align mark, and a fourth lead dummy line disposed between the second lead dummy line and the second lead align mark.

16. The display device of claim 15, wherein:
the third lead dummy line is disposed to partially overlap the first panel align mark; and
the fourth lead dummy line is disposed to partially overlap the second panel align mark.

* * * * *